(12) United States Patent
Yoon

(10) Patent No.: US 8,872,387 B2
(45) Date of Patent: Oct. 28, 2014

(54) NON-CONTACT SELECTION SWITCH

(76) Inventor: Il Shik Yoon, Gyeonggi-do (KR)

( * ) Notice: Subject to any disclaimer, the term of this patent is extended or adjusted under 35 U.S.C. 154(b) by 0 days.

(21) Appl. No.: 13/261,714

(22) PCT Filed: Nov. 3, 2011

(86) PCT No.: PCT/KR2011/008301
§ 371 (c)(1),
(2), (4) Date: Nov. 14, 2013

(87) PCT Pub. No.: WO2012/111904
PCT Pub. Date: Aug. 23, 2012

(65) Prior Publication Data
US 2014/0062220 A1    Mar. 6, 2014

(51) Int. Cl.
| | | |
|---|---|---|
| *H01H 35/14* | (2006.01) |
| *H03K 17/00* | (2006.01) |
| *H03K 17/96* | (2006.01) |
| *B66B 1/46* | (2006.01) |
| *H03K 17/94* | (2006.01) |

(52) U.S. Cl.
CPC ......... *H03K 17/00* (2013.01); *B66B 2201/4638* (2013.01); *H03K 17/9629* (2013.01); *H03K 2217/94112* (2013.01); *B66B 1/463* (2013.01); *H03K 17/9631* (2013.01); *B66B 1/461* (2013.01); *H03K 2217/94111* (2013.01); *H03K 17/943* (2013.01)
USPC ............ 307/117; 307/120; 187/391; 187/395

(58) Field of Classification Search
CPC ............ B66B 1/14; B66B 1/462; B66B 3/00; B66B 1/468; B66B 1/34; B66B 5/0006; H03K 17/943; H03K 17/79; H03K 17/945; H03K 17/136; G06F 3/0421; G06F 3/042; G06F 3/0436; G06F 3/0433; G06F 3/043; G01P 13/00; G01P 3/4802; A47L 15/4259; B41J 3/36; B65H 59/40; H01H 35/14
See application file for complete search history.

(56) References Cited

U.S. PATENT DOCUMENTS

| | | | | |
|---|---|---|---|---|
| 4,716,992 A | * | 1/1988 | Kunii ............................. | 187/395 |
| 7,597,177 B2 | * | 10/2009 | Oh et al. ....................... | 187/395 |
| 2006/0011419 A1 | * | 1/2006 | Chuang ......................... | 187/316 |

* cited by examiner

*Primary Examiner* — Jared Fureman
*Assistant Examiner* — Terrence Willoughby
(74) *Attorney, Agent, or Firm* — Richard John Bartz

(57) ABSTRACT

The present invention relates to a non-contact switch which is used for an elevator or general automatic doors, and comprises: buttons B including a push button or an optical sensor button for selecting an elevator movement or opening an automatic door; a pair of long sensor blocks 10, which are installed adjacent to or above the push button and arranged so as to face each other with a gap 12 equivalent to the width of one to two human fingers therebetween; and a plurality of sensors S which are installed in a single file on the surfaces of the sensor blocks that face each other, wherein a sensor detects movement of a human finger moving with the gap 12 at or above a predetermined length or at or above a predetermined speed and selects an upward or downward movement for a destination floor for the elevator or opens the automatic door.

4 Claims, 12 Drawing Sheets

NON-CONTACT SELECTION SWITCH

TECHNICAL FIELD

The present invention relates to a non-contact switch used in an elevator or a general automatic door.

BACKGROUND ART

As switches for upward movement, downward movement, and floor selection of an elevator, a mechanical push-button type switch, a touch pad type switch, a beam switch using an optical sensor, and the like are generally used.

FIG. 1 illustrates three types of switches, and FIGS. 1a to c are schematic views of the touch pad type switch (TS), the push-button type switch (BS), and the optical sensor type switch (SS), and an upper part thereof is a perspective view and a lower part thereof is a plan view. As illustrated in FIG. 1, existing switches are touch types in which a human finger directly contacts the surface of a button, such as the touch pad type or push button type, and even in the case of the optical sensor type of FIG. 1c, since a human finger needs to deeply press enough for a sensor to sense the finger, there is a high possibility that the finger will contact the inside of the switch. The contact type switch may be unsanitary because there is a high risk that a human could be infected with bacteria or viruses through the contact. Further, when people with disability including the blind or the visually disabled unconsciously press their fingers on the switch while fumbling for the switch, the switch may be actuated, and as a result, the contact type switch may be inappropriate for people with disability to use.

Meanwhile, in modern elevators, switches marked with raised letters need to be separately installed at a significantly low position for the visually disabled or the physically handicapped to use apart from the general switches, in addition to switches which can be used by non-disabled persons. The reason for installing the switches for people with disability at large intervals from the general switches is to reduce a risk that people with disability will improperly operate the elevator by touching the general switches by mistake. To this end, wires for two switches for the switches for the people with disability are separately required, in addition to the general switches.

DISCLOSURE

Technical Problem

The present invention is contrived to consider such a problem in the related art, and an object of the present invention is to simplify installation and wiring, and significantly reduce installation cost by integratedly installing the switches for the non-disabled persons and the disabled persons in one panel.

Another object of the present invention is to provide a sanitary switch without a risk of infection by allowing the non-disabled persons to operate the switch in a non-contact scheme.

Yet another object of the present invention is to provide a safe switch which does not improperly operate by erroneous contact that may occur while the visually disabled or other disabled persons fumble for the switch.

Technical Solution

In order to achieve the objects of the present invention, a switch installed beside an elevator door of a building hallway to select upward movement, downward movement, or a destination floor of an elevator or installed beside an automatic door to open the automatic door which is automatically opened and closed, includes: a pair of long sensor block sets 10 disposed to face each other with a gap 12 as thick as two and three human fingers F; and a plurality of sensors S installed in line on surfaces of the sensor blocks facing each other, in which, when the human finger F moves with the gap 12, the sensors S sense a direction, a length, and a speed of the finger F that moves. Meanwhile, the elevator may ascend or the destination floor may be selected, or the automatic door may be opened by using the information sensed as described above.

Buttons B including a push button or an optical sensor button, which actuate the elevator or the automatic door when the buttons are pressed by the human finger, may be disposed around, that is, beside, above, or below the sensor block sets 10. In this case, the plurality of buttons B may be provided and the sensor block sets 10 may be arranged beside the respective buttons B one by one, and further, each of the plurality of sensor block sets 10 is not parallel to the sensor block set facing each sensor block set 10 and forms an angle to be disposed in a V shape.

Advantageous Effects

According to a non-contact type selection switch of the present invention configured as above, switches for non-disabled persons and disabled persons can be integrated into one panel, and as a result, installation cost can be significantly reduced, and the switch is operated by non-contact and thus is sanitary, and malfunction, which may occur while the disabled persons fumble for the switch, can be significantly reduced.

DESCRIPTION OF DRAWINGS

FIG. 9 is an operating flowchart of up and down switches of a top floor and a bottom floor requiring only one switch or a general ON/OFF switch and FIG. 8 is an operating flowchart of a floor with both up and down switches;

BEST MODE

Figure 1A:
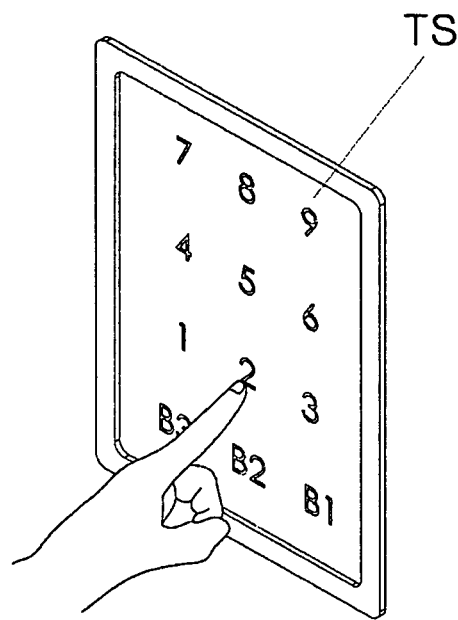
FIG. 1 is a schematic view of three types of switches in the related art.
Figure 1A:
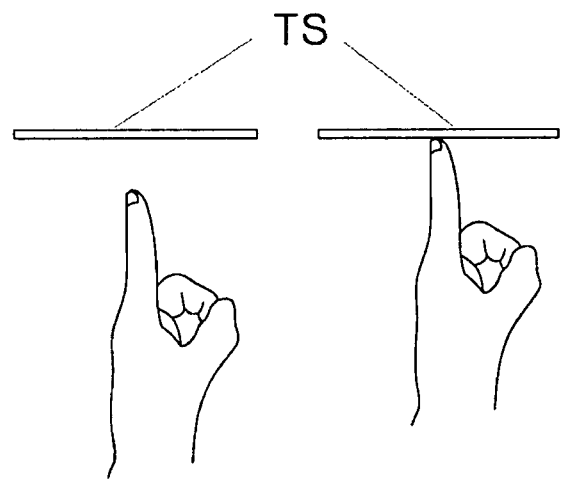
Figure 1B:
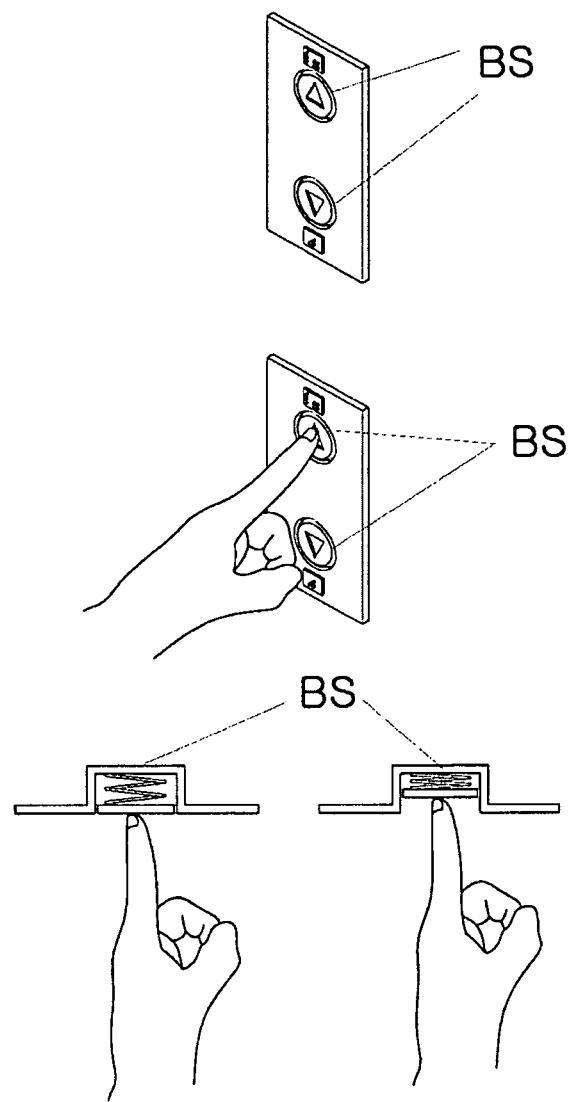
Figure 1C:
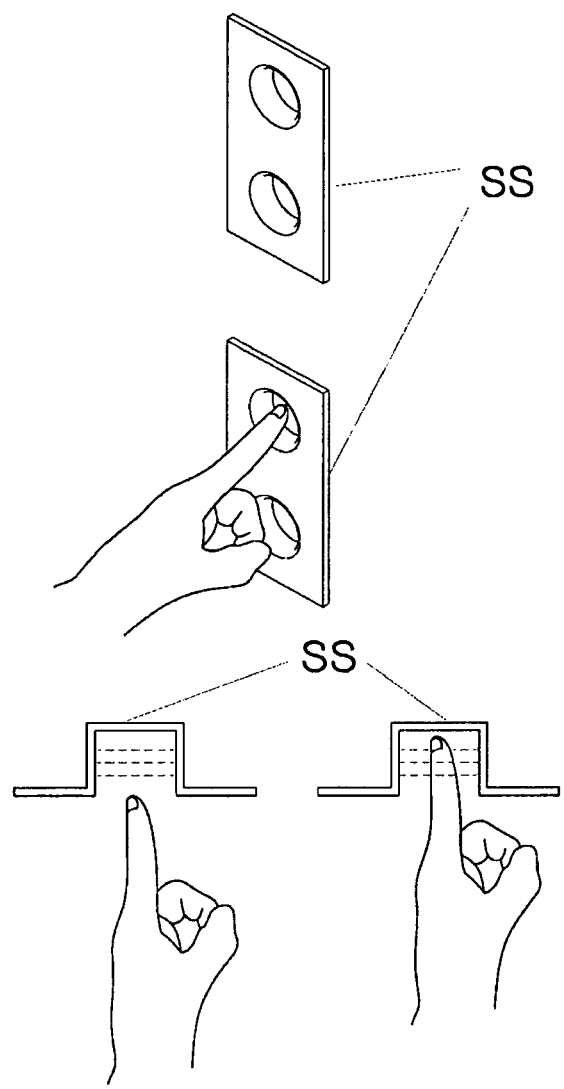
Figure 2:
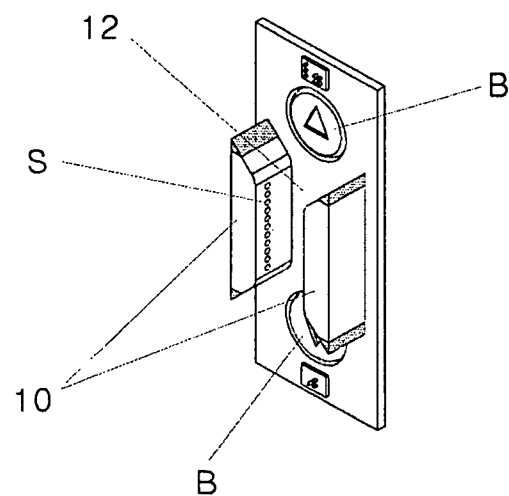
FIG. 2 is a perspective view of a non-contact switch according to an embodiment of the present invention.

FIG. 2 is a perspective view of a non-contact switch according to an embodiment of the present invention. The switch is mostly installed beside an elevator to select upward or downward movement of the elevator, but may be used to select a destination floor as described below. Meanwhile, the switch may be installed beside an automatic door which is automatically opened and closed, and this will be described below in detail.

The non-contact switch of the present invention includes a button B, a sensor block set 10, and a sensor S.

The button B is a button used for operating the elevator, that is, selecting elevation or the destination floor by pressing the button with human hands, and may include both a push button and an optical sensor button described in the related art. The sensor block set 10 is installed beside or above the button B and constituted by a pair of blocks, and the pair of blocks are disposed to face each other substantially with a gap 12 of two or three fingers, that is, two to three fingers of a human. Further, the sensor S is installed in line on surfaces of the sensor blocks facing each other, and as the sensor, an optical sensor or an infrared sensor such as a photo beam may be generally used.

Figure 3:
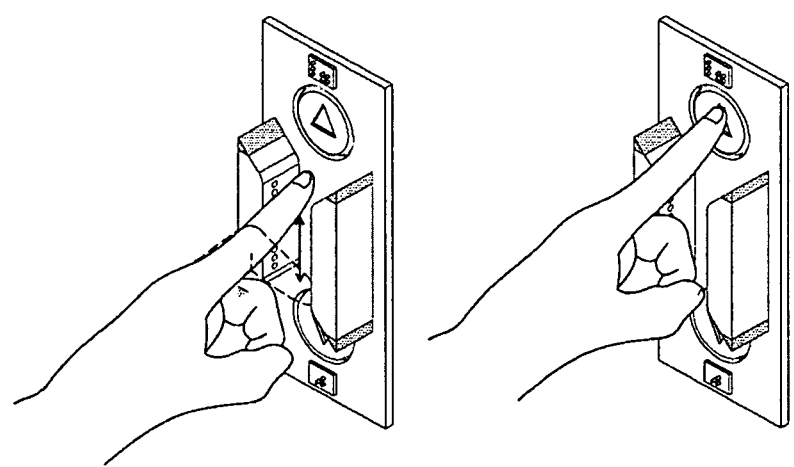
FIG. 3 is a use example of the non-contact switch of FIG. 2.

FIG. 3 is a use example of the switch configured as above.

A left side of FIG. 3 is a perspective view illustrating an example in which a human finger moves with the gap 12 in the middle of the sensor block set 10, and only when the finger is bent against the gap 12 like a break line, a lower button is actuated, and in contrast, when the finger is moved up, an upper button is actuated. Meanwhile, as illustrated in a right side of FIG. 3, the button B may be directly pressed with the finger. The switch operates by only one of the two methods.

In the case of the switch, since the sensor block set 10 is projected, there is no concern that the visually disabled will cause the malfunction by erroneous contact. The actuation (upward or downward movement in the embodiment) of the elevator may be selected by judging a distance, a speed, and a direction of the finger that moves with the gap 12, and since setting the operating method is obvious to those skilled in the art, a more detailed description thereof will be omitted. For example, only when the finger moves ⅔ or more of the total length of the gap 12, the elevator may be set to be actuated or the elevator may be set to ascend or descend depending on the direction of the finger. The operating method will be described below in detail.

Figure 4:
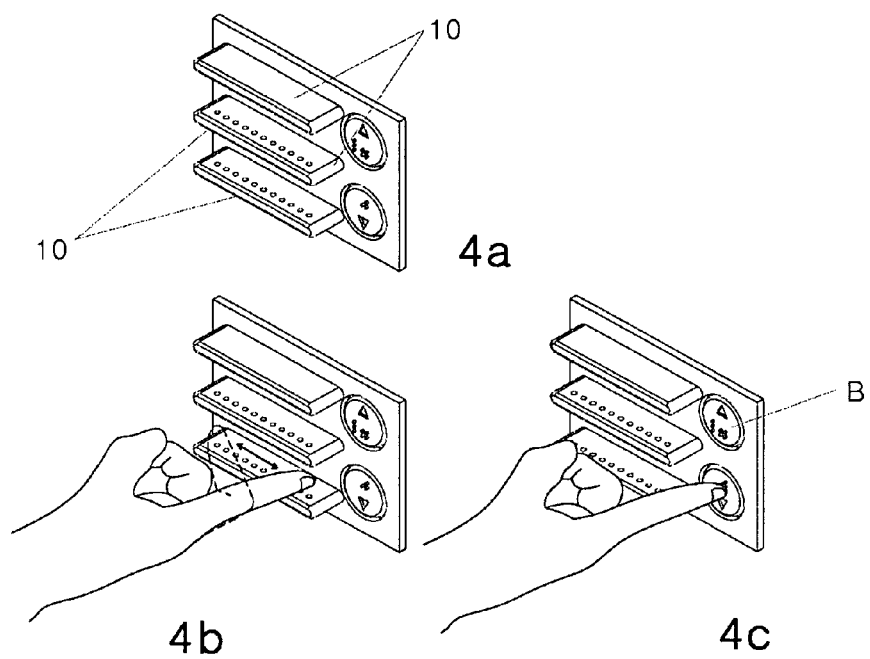
FIG. 4 is a perspective view of an example in which a sensor block set 10 is horizontally disposed.

FIG. 4 illustrates an example in which the sensor block set 10 is horizontally disposed. Herein, an example in which the sensor block set is constituted by three sensor blocks to configure total two sets is illustrated, and an operating method thereof is the same as that of the example of FIG. 3. For example, as illustrated in FIG. 4*b*, when the finger moves or the button B is pressed with the gap of the sensor block sets 10, the elevator is actuated.

Figure 5:
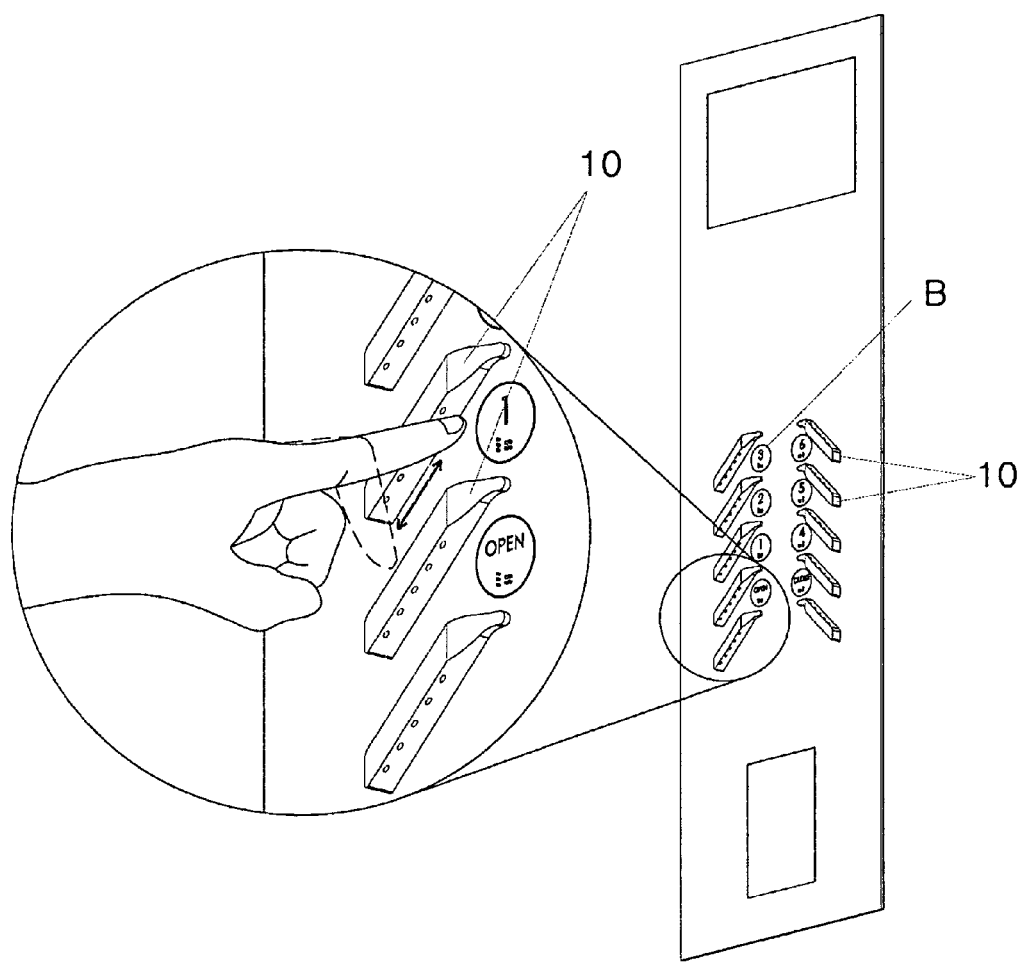
FIG. 5 is a switch installed in an elevator cage according to another embodiment of the present invention and a partially enlarged diagram thereof.

FIG. 5 illustrates a button switch in the elevator cage not a hallway and a partially enlarged diagram thereof, and in this case, several buttons such as a floor selection button (floor button) and opening and closing buttons of the elevator are generally provided. Even in this case, as illustrated, the sensor block set 10 may be distributed for each button. That is, the sensor block sets 10 are arranged beside the respective buttons B one by one, and when the finger moves in each sensor block set in accordance with a predetermined rule, a desired floor may be selected or the elevator door may be closed or opened. That is, as illustrated in an enlarged diagram in a circle, a first floor may be selected by moving the finger with the sensor block set 10 corresponding to the first floor.

Meanwhile, in the case of the arrangement, it is preferable that each of the plurality of sensor block sets 10 is not parallel to or in a line to the sensor block set facing each sensor block set. For example, in the figure, both sensor block sets corresponding to a third floor and a sixth floor are not disposed in line but are disposed to form an angle. The reason is that, when both sensor block sets are disposed in line, the visually disabled or children may actuate both the sensor block sets of the third floor and the sixth floor at once with the finger by mistake. However, when the sensor block sets facing each other form a predetermined angle to be disposed in a V shape, there is no concern that two floors will be selected at once by mistake as described above.

Figure 6:
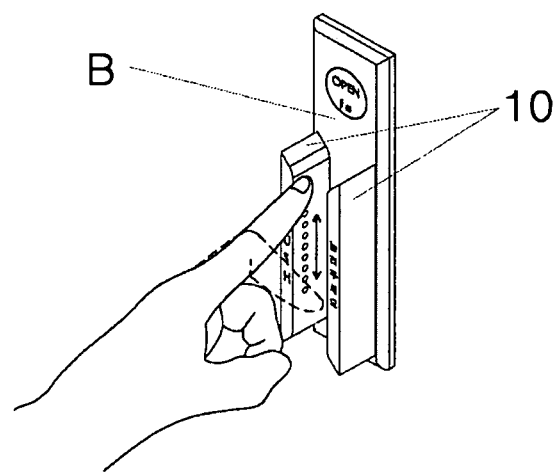
FIG. 6 is a perspective view illustrating an example in which the present invention is applied to a general automatic door switch.

FIG. 6 is a perspective view illustrating an example in which the present invention is applied to a general automatic door switch.

As illustrated, the sensor block set 10 is installed above the button B installed beside the general automatic door. The finger is moved at the middle gap of the sensor block set 10 to actuate the automatic door similarly to the aforementioned embodiment. That is, when the finger is moved as marked with a break line, the automatic door is opened even though the button B is not pressed.

Figure 7:
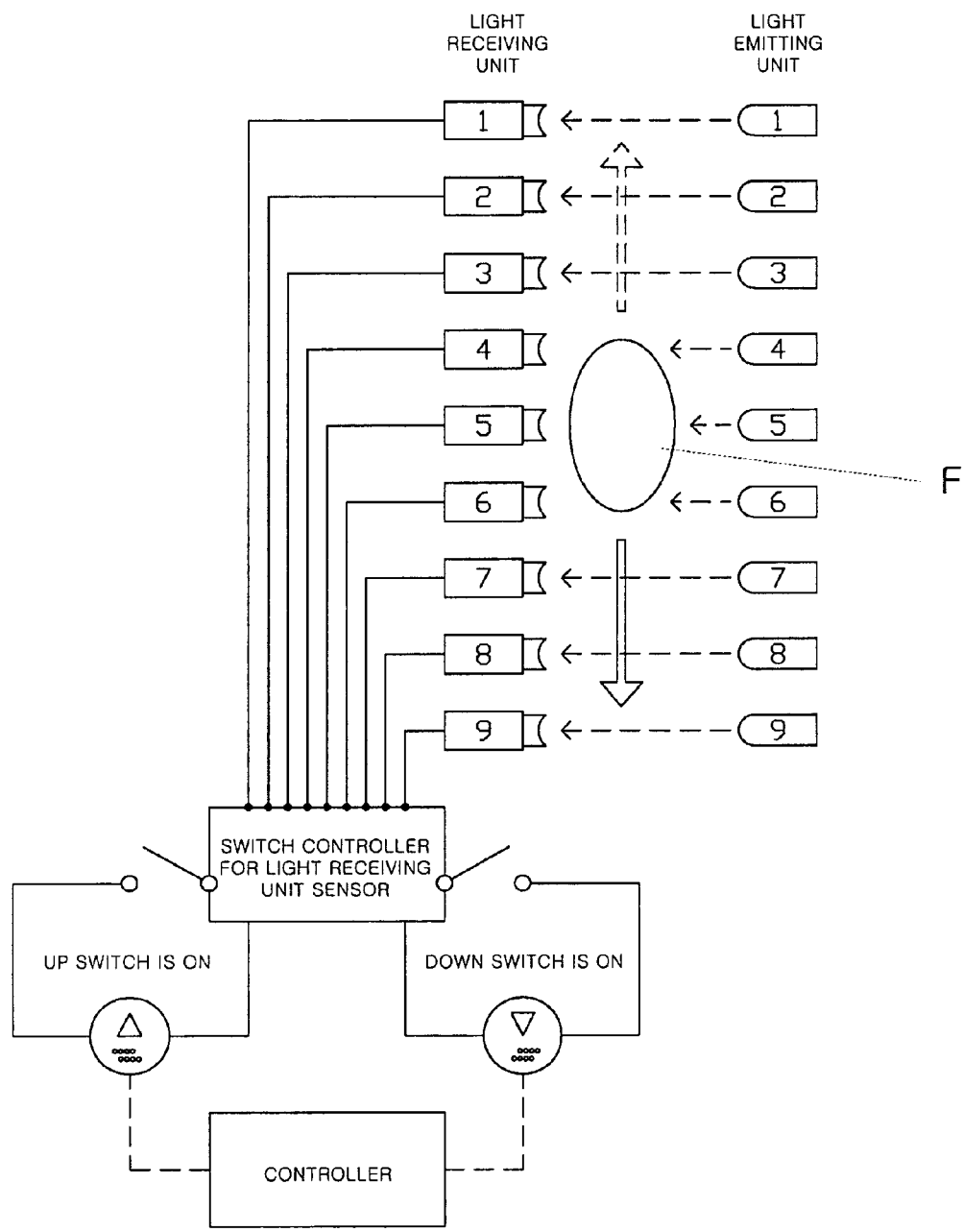
FIG. 7 is a block diagram for describing an operating principle of the sensor block set when the non-contact switch is formed by a photo sensor.

FIG. 7 is a block diagram for describing an operating principle of the aforementioned sensor block set 10 when the non-contact switch is formed by the photo sensor, and a right sensor block is constituted by a plurality of (herein, nine) light emitting units and a left sensor block is also constituted by the same number of light receiving units. The light receiving unit is connected to a light receiving unit sensor switch controller, and both up and down switches of an UP switch and a DOWN switch are connected to the controller. A finger F is a part marked with an oval between the light receiving unit and the light emitting unit, and while the finger F moves up and down in an arrow direction, light, which is incident in the light receiving unit from the light emitting unit, is blocked.

Figure 8:
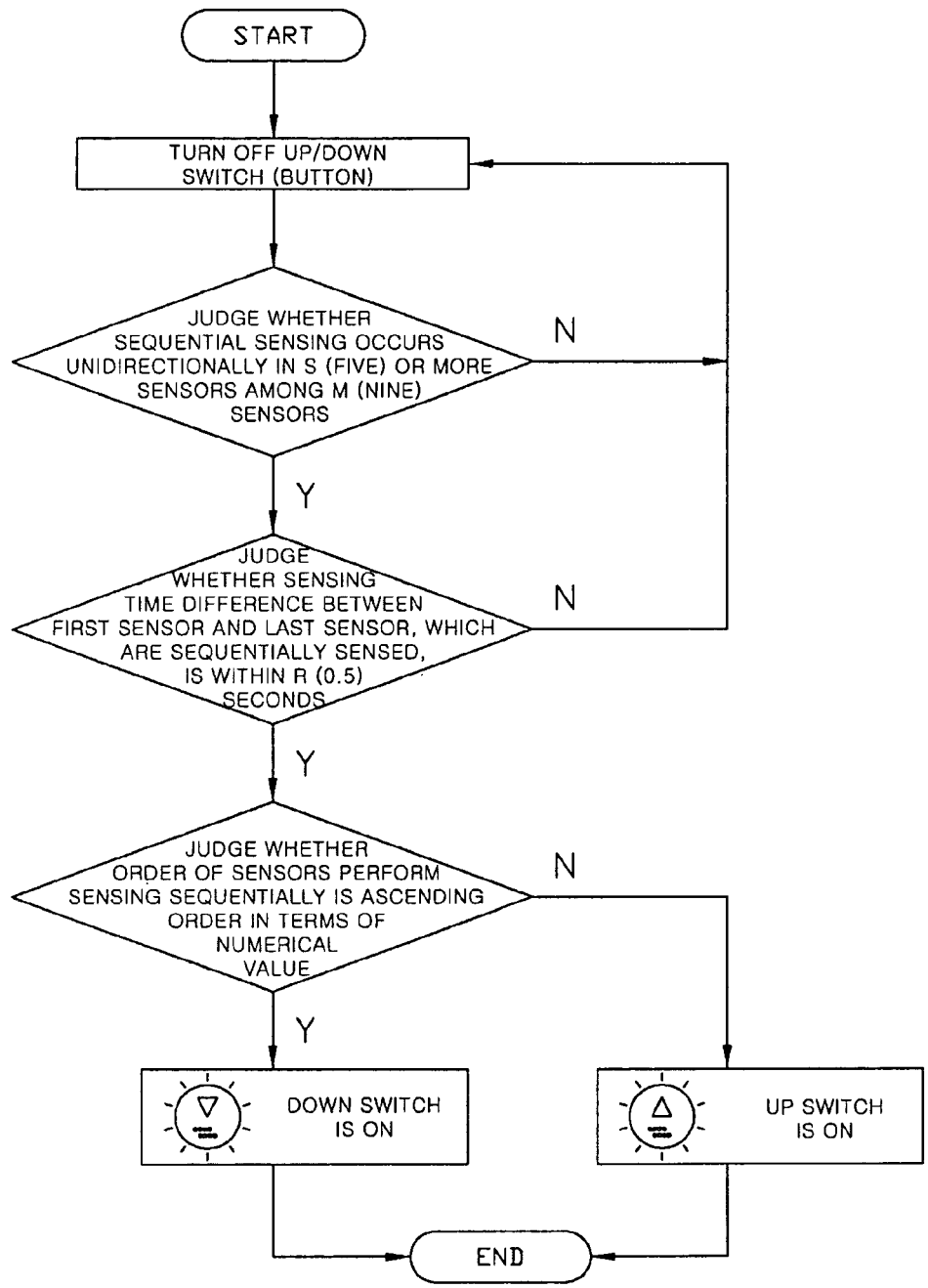
FIGS. 8 and 9 are flowcharts of an operating state of the sensor block set.
Figure 9:
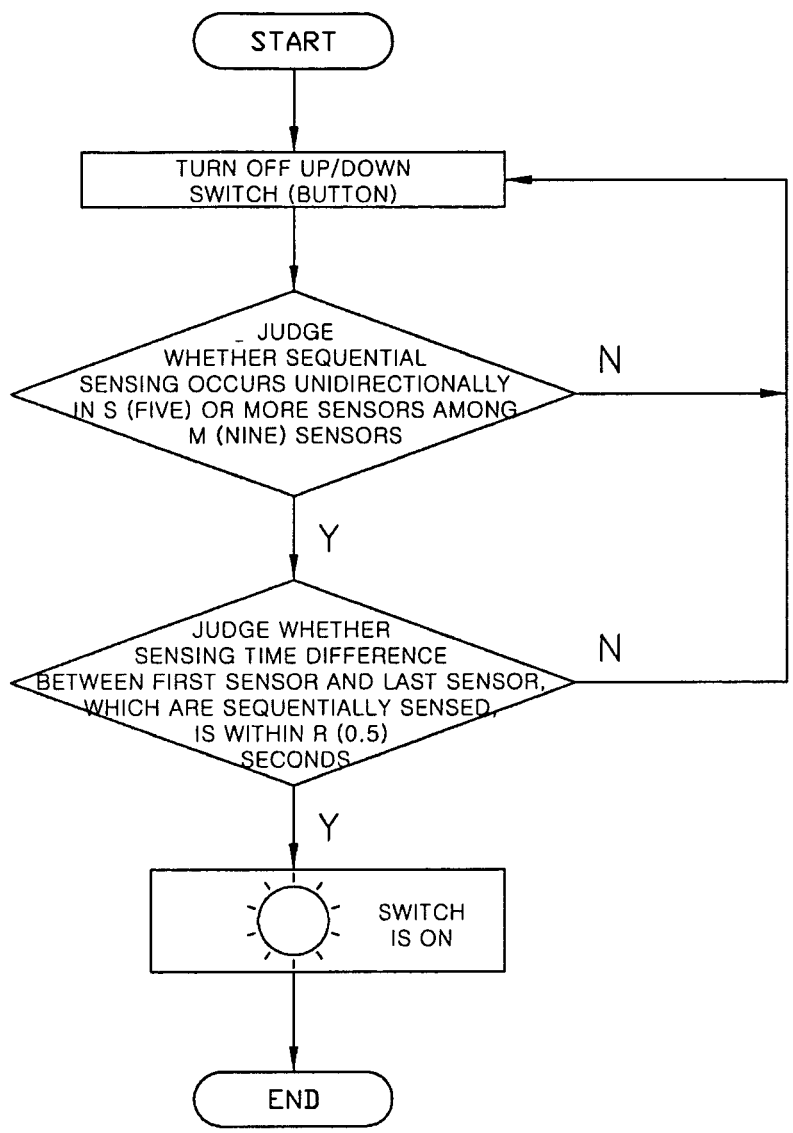

FIGS. 8 and 9 are flowcharts of an operating status of the sensor block set 10, and FIG. 9 is a flowchart of a top floor and a bottom floor requiring only one switch and FIG. 8 is a flowchart of a floor with both up and down switches.

In the case of general floors other than the top floor and the bottom floor (see FIG. 8), when both the up and down switches are in an off state, it is judged whether sequential sensing occurs unidirectionally in s sensors among m, herein, nine sensors, by the movement of the finger. In the embodiment, s is set as five. When the sequential sensing occurs, it is judged whether a time difference between first and last sensors sensed in a next step is within R. In the embodiment, R is set as 0.5 seconds. When the sensing is achieved within the time, it is judged whether a sensing order of the sensor is an ascending order in the next step. When the sensing order is the ascending order, the down switch is in an on state, and when the sensing order is not the ascending order, the up switch is in the on state. In general, when the sensing order is the ascending order, the finger moves downward, and otherwise, the finger moves upward.

Meanwhile, in the case of the top floor and the bottom floor, only the up switch or the down switch is provided. Therefore, in this case, as illustrated in FIG. 9, it is not necessary to judge whether the sensing order of the sensor is the ascending order, and when the sensing is achieved within a predetermined time, it is assumed that the switch is actuated.

As described above, when both up and down switches or one of both switches and the non-contact switch are together provided, an actuation relationship of the non-contact switch is described, but even when only the non-contact switch is provided without the elevation switch, the actuation relationship may be applied. Further, the non-contact switch of the present invention may be applied to even a general ON/OFF switch in addition to the elevator.

Figure 10:
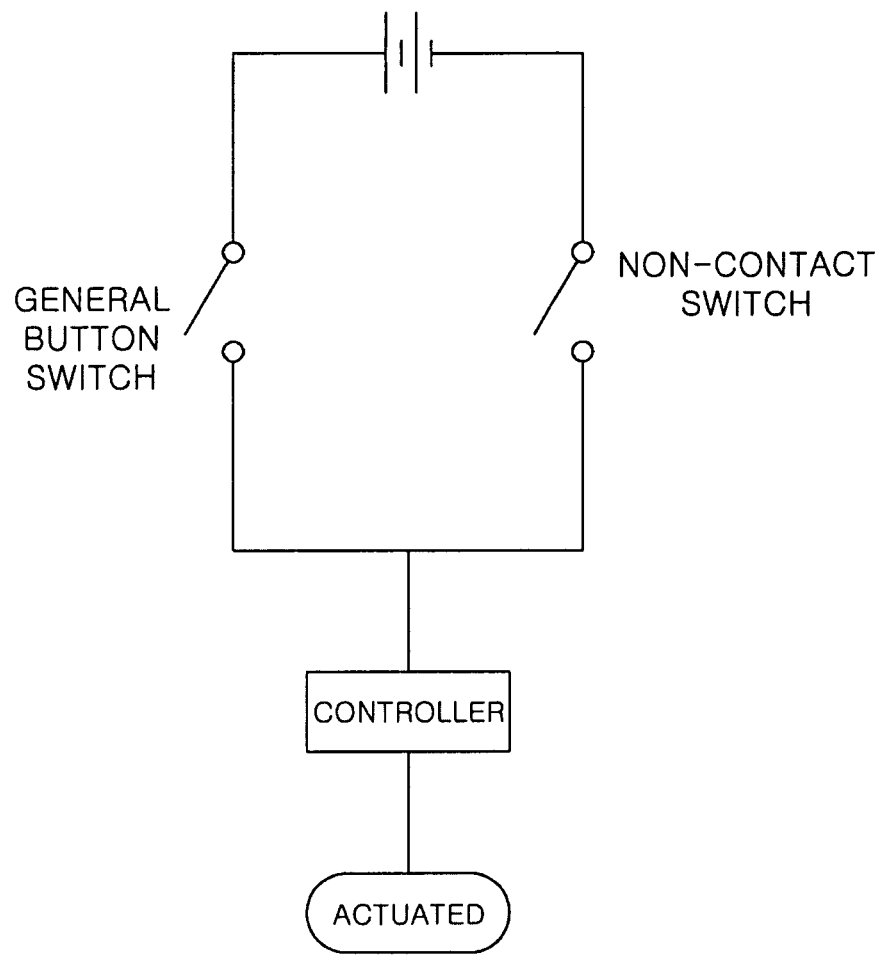
FIG. 10 is a schematic view illustrating a relationship between a general button switch of an elevator and the non-contact switch of the present invention when the general button switch and the non-contact switch are simultaneously used.

FIG. 10 is a schematic view illustrating a relationship between a general button switch of an elevator and the non-contact switch of the present invention when the general button switch and the non-contact switch are simultaneously used. In this case, the general button switch and the non-contact switch of the present invention have a parallel relationship. That is, even though either switch is used, the elevator may be actuated.

Figure 11:
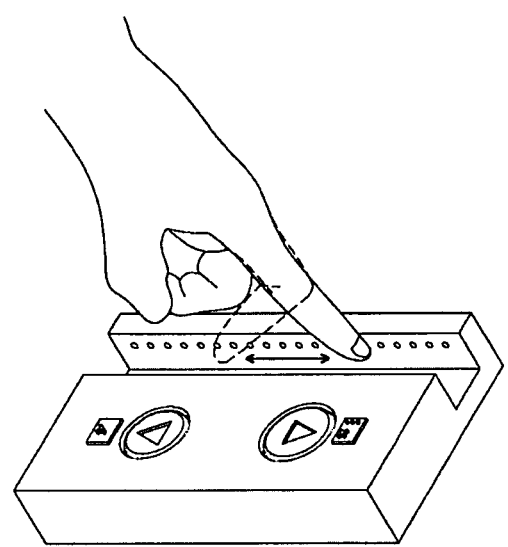
FIG. 11 is a perspective view illustrating another example of the non-contact switch according to the present invention, and illustrates a status in which the non-contact switch is disposed not between the elevation buttons but beside the elevation buttons and the non-contact switch operates when actuated by a human finger.
Figure 11:
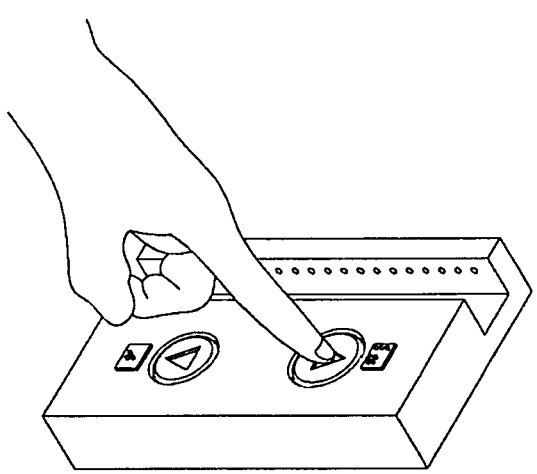

FIG. 11 is a perspective view illustrating another example of the non-contact switch according to the present invention, and illustrates a status in which the non-contact switch is disposed not between the elevation buttons but beside the elevation buttons and the non-contact switch operates when actuated by a human finger, and in FIG. 11, a left diagram illustrates a status in which the non-contact switch is actuated, and a right diagram illustrates a status in which the elevation button is directly pressed. As such, the non-contact switch according to the present invention may be used in various combinations with the existing elevation button.

The non-contact switch described above is just an example, and even a case where only any one of the light receiving unit and the light emitting unit is constituted by a plurality of sensors may be included in the scope of the present invention.

Further, the sequential sensing number and the sensing time may also be, in any degree, adjusted as necessary.

The invention claimed is:

1. A non-contact selection switch installed beside an elevator door of a building hallway to select upward movement, downward movement, or a destination floor of an elevator or installed beside an automatic door to open the automatic door which is automatically opened and closed, the switch comprising:

a pair of long sensor block sets 10 disposed to face each other with a gap 12 as thick as two to three human fingers F; and a plurality of sensors S installed in line on surfaces of the sensor blocks facing each other, wherein when the human finger F moves with the gap 12, the sensors S sense a direction, a length, and a speed of the finger F that moves.

2. The non-contact selection switch of claim 1, wherein buttons B including a push button or an optical sensor button, which actuate the elevator or the automatic door when the buttons are pressed by the human finger, are disposed around, that is, beside, above, or below the sensor block sets 10.

3. The non-contact selection switch of claim 2, wherein the plurality of buttons B is provided and the sensor block sets 10 are arranged beside the respective buttons B one by one.

4. The non-contact switch of claim 3, wherein each of the plurality of sensor block sets 10 is not parallel to the sensor block set facing each sensor block set 10 and forms an angle to be disposed in a V shape.

* * * * *